United States Patent
Yuan

(10) Patent No.: US 6,287,735 B2
(45) Date of Patent: *Sep. 11, 2001

(54) METHOD AND APPARATUS FOR CONTROLLING THE LEVELING TABLE OF A WAFER STAGE

(75) Inventor: Bausan Yuan, San Jose, CA (US)

(73) Assignee: Nikon Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/153,935

(22) Filed: Sep. 16, 1998

(51) Int. Cl.$^7$ ........................................ G03F 7/20
(52) U.S. Cl. ....................... 430/30; 430/327; 318/648; 318/652
(58) Field of Search ............... 430/311, 30, 327; 318/561, 648, 652; 356/400; 355/53

(56) References Cited

U.S. PATENT DOCUMENTS

| | | | |
|---|---|---|---|
| 4,221,995 | 9/1980 | Barkman | 318/616 |
| 4,223,257 | 9/1980 | Miller | 318/594 |
| 4,818,885 | 4/1989 | Davis et al. | 250/492.2 |
| 4,977,361 | 12/1990 | Phillips et al. | 318/640 |
| 5,379,108 | 1/1995 | Nose et al. | 356/400 |
| 5,448,332 | 9/1995 | Sakakibara et al. | 355/53 |
| 5,493,402 | 2/1996 | Hirukawa | 356/400 |
| 5,543,921 | 8/1996 | Uzawa et al. | 356/401 |
| 5,563,798 | 10/1996 | Berken et al. | 364/478.06 |
| 5,663,783 | * 9/1997 | Ueda | 355/53 |
| 5,812,420 | * 9/1998 | Takahashi | 365/508 |

OTHER PUBLICATIONS

Haykin, S., *Adaptive Filter Theory*, Prentice Hall, 2d Edition pp. 299–359 (1991).

* cited by examiner

Primary Examiner—Kathleen Duda
(74) Attorney, Agent, or Firm—Morrison & Foerster LLP

(57) ABSTRACT

A method and apparatus for controlling the leveling table of a wafer stage is described. More generally, the invention includes control circuitry for controlling motion of a stage, where the stage is adapted to support a workpiece. The control circuitry measures position in a vicinity of the workpiece. Based upon the measured position, the control circuitry drives the stage toward a target position while accounting for nonlinear dynamics of the stage. The nonlinear dynamics may include inertia, in which case the control circuitry adaptively estimates the inertia of the stage. The nonlinear dynamics may also include tilt due to acceleration or deceleration of the stage, in which case the circuitry adaptively estimates the tilt of the stage. The stage may generally travel in a plane, and the circuitry measures position in a direction orthogonal to the plane. The circuitry may measure the position of the workpiece itself, or the position of an upper surface of the stage. The workpiece may be a semiconductor wafer in an exposure system.

23 Claims, 3 Drawing Sheets

METHOD AND APPARATUS FOR CONTROLLING THE LEVELING TABLE OF A WAFER STAGE

BACKGROUND

1. Field of the Invention

The present invention relates to semiconductor manufacturing, and more particularly to controlling the leveling (upper) table of a wafer stage in a wafer stepper.

2. Description of the Related Art

During the manufacture of integrated circuits, circuit patterns for multiple chips are made on a single semiconductor wafer using techniques such as e-beam or ultraviolet photolithography. The wafer rests on a wafer stage under the control of a feedback wafer controller. The wafer stage includes a lower XY stage and an upper leveling stage. To control the leveling stage, the feedback may be measured at the surface of the wafer, or alternatively at the actuators driving the leveling stage. The first configuration introduces inaccuracies into the system because of the delay between the measurement at the wafer surface and the actuation points below the leveling stage. By measuring position at the actuators themselves, the second technique eliminates this delay, but provides an inaccurate representation of the measurement at the wafer surface.

In particular, the leveling stage driving mechanism, including the actuators and the upper leveling stage itself, exhibits nonlinear dynamics. The nonlinear effects hamper the ability of the system to quickly and accurately position the wafer stage at a desired height and keep the wafer level as it moves. Improvements in positioning and leveling would result in a higher throughput and improved exposure image quality.

FIG. 1 is a simplified block diagram illustrating an example of a conventional wafer scanner-stepper, such as the Nikon Model NSR 201, used in the manufacture of semiconductor chips. A radiant energy source 100, such as an ultraviolet light, is directed towards a reticle or mask 102. The light passing through the mask falls on an exposure area of a wafer 104. As a result, the area of the reticle illuminated by the light projects a corresponding pattern onto the exposure area of the wafer. The wafer 104 rests on a wafer stage 106, which moves under the control of a feedback wafer controller 108. The position of the wafer 104 is detected by a wafer position sensor 110, which can be implemented with a laser interferometer for measuring position in the XY direction and an encoder for measuring position in the vertical direction, for example.

The reticle may be held by a two-part reticle stage structure which includes a fine motion stage 112 and a coarse motion stage 114. The coarse stage motion is controlled by a coarse stage controller 116, and the fine stage motion is controlled by a fine stage controller 118. The XY position of the reticle is sensed by a reticle position sensor 120, which can be implemented by a laser interferometer, for example. The present invention may be employed with this system or with many other scanner-steppers known in the art.

FIG. 2 illustrates the wafer stage 106 in more detail. The wafer stage 106 moves the wafer 104 in three dimensions. The wafer stage 106 includes a lower XY stage 200 and an upper leveling stage 202. A wafer chuck 204 on the leveling stage 202 supports the wafer 104. Interferometer mirrors 206 mounted on the leveling stage 202 reflect light back to the sensor circuitry 110 to determine the position of the leveling stage 202 in the XY direction. Interposed between the lower stage 200 and upper stage 202 are leveling drive mechanisms or actuators 208.

As is well known in the art, the XY stage 200 carries the leveling stage 202, and thus the wafer 104, along a path in the XY plane. Typically, under control of the leveling stage 202 by three leveling mechanisms 208, the wafer is positioned to a desired height and maintained in a level position as the wafer travels. As is known in the art, each leveling drive mechanism 208 may include a motor 210 that turns a lead screw 212. The screw 212 is threaded into a wedge 214, and also coupled to an encoder 216 of sensor 110. Based upon rotation of the screw, the encoder 216 provides a measurement related to the height of a roller 218 supported by the wedge and thus related to the height of the leveling table 202.

Rotation of the screw 212 translates rotational motion of the motor 210 into translational motion of the wedge 214. The wedge 214 supports the roller 218, which has a fixed axle. As the wedge 214 moves in the XY plane, that motion is translated into orthogonal vertical motion by the roller 218 moving up or down the wedge 214. In this manner, three actuators 208 control the vertical position and leveling of the upper leveling stage 202.

The scanner-stepper operates as follows. A control computer 122 generates commands specifying the position of the wafer. In response, the wafer controller 108 causes the wafer stage 106 to move toward the desired or target position. The actual position of the wafer 104 is detected by the wafer sensor 110 and is fed back to a first adder 124. The difference between the commanded position and the sensed position is the following error of the wafer stage. The wafer controller 108 adjusts the position of the wafer stage 106 in response to this error.

Because of limitations on the resolving power of projection lenses used in the light source 100, the wafer is typically exposed to only a small area of the reticle mask 102 to maintain a high resolution. The reticle motion is synchronized with the wafer motion to expose more of the reticle to the wafer. Typically, the coarse controller 116 first moves the coarse reticle stage 114 in a coarse adjustment. The reticle sensor 120 feeds the position of the reticle to a second adder 126, which compares the sensed reticle position to the sensed wafer position. The difference is the synchronization error, which is used by the fine controller 118 to adjust the fine reticle stage 112 in order to minimize the synchronization error.

During exposure, the wafer 104 is scanned with the mask pattern at a constant velocity. Scanning is performed on a row of chip areas laid out in the Y direction. When the end of a row is reached, the control computer 122 inputs a command to step the wafer in the orthogonal X direction so that scanning may proceed on the next row. After stepping, motion in the X direction is halted and scanning continues in the reverse Y direction. As a result, the wafer is moved in a serpentine pattern. For more information on serpentine scanning, please refer to U.S. Pat. No. 4,818,885, issued to Davis, et al., which is incorporated by reference herein.

SUMMARY OF THE INVENTION

The present invention provides a method and apparatus for controlling the leveling table of a wafer stage. More generally, the invention includes control circuitry for controlling motion of a stage, where the stage is adapted to support a workpiece. The control circuitry measures position in a vicinity of the workpiece. Based upon the measured position, the control circuitry drives the stage toward a target position while accounting for nonlinear dynamics of the stage. The nonlinear dynamics may include inertia, in which case the control circuitry adaptively estimates the inertia of the stage. The nonlinear dynamics may also include tilt due to acceleration or deceleration of the stage, in which case the circuitry adaptively estimates the tilt of the stage.

The stage generally travels in a plane, and the circuitry measures position in a direction orthogonal to the plane. The circuitry may measure the position of the workpiece itself, or the position of an upper surface of the stage. The workpiece may be a semiconductor wafer in an exposure system.

DETAILED DESCRIPTION OF THE INVENTION

The present invention provides a method and apparatus for controlling the leveling table of a wafer stage. In the following description, numerous details are set forth in order to enable a thorough understanding of the present invention. However, it will be understood by those of ordinary skill in the art that these specific details are not required in order to practice the invention. Further, well-known elements, devices, process steps and the like are not set forth in detail in order to avoid obscuring the present invention.

Figure 1:
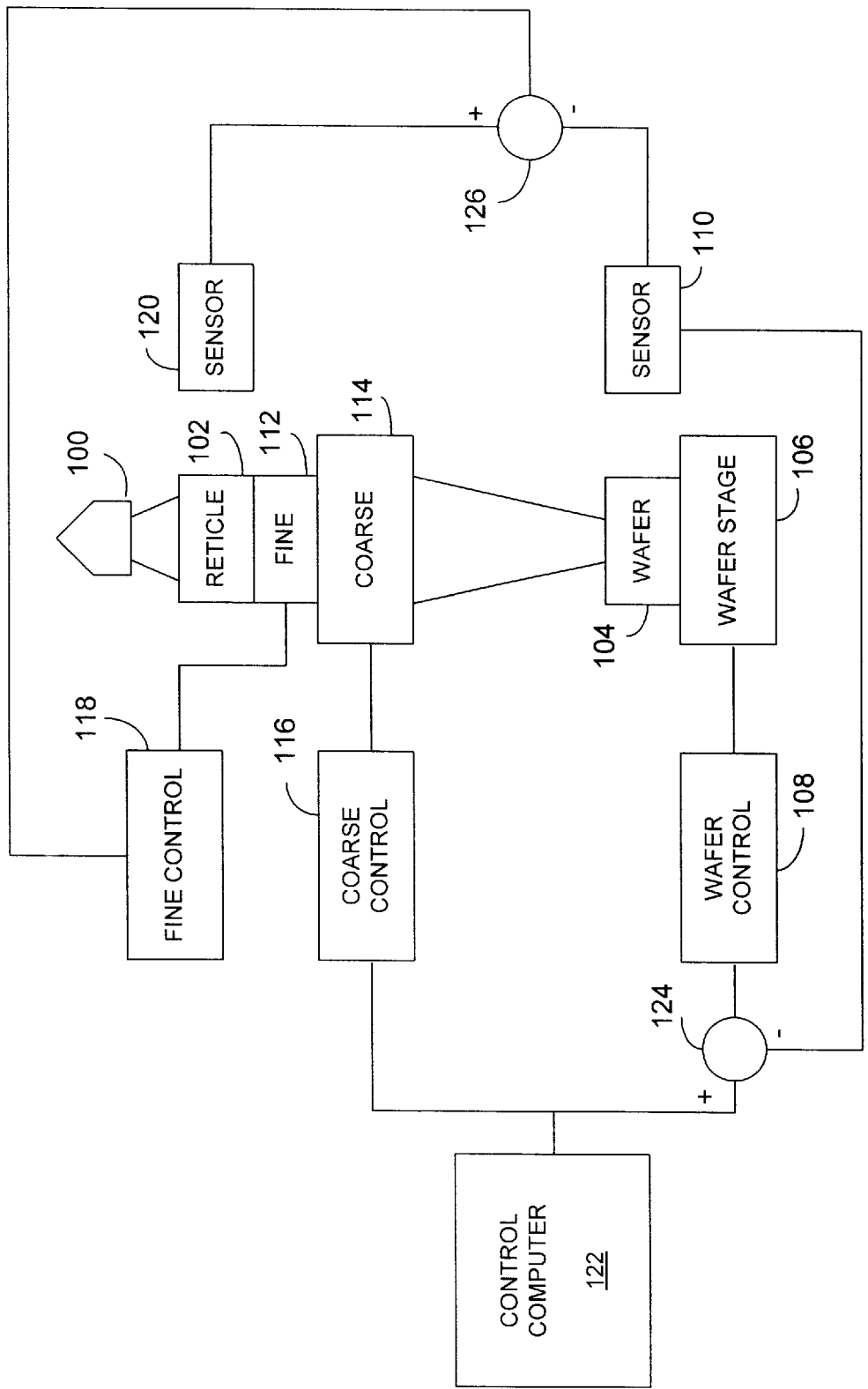
FIG. 1 is a simplified block diagram illustrating a wafer scanner-stepper.
Figure 2:
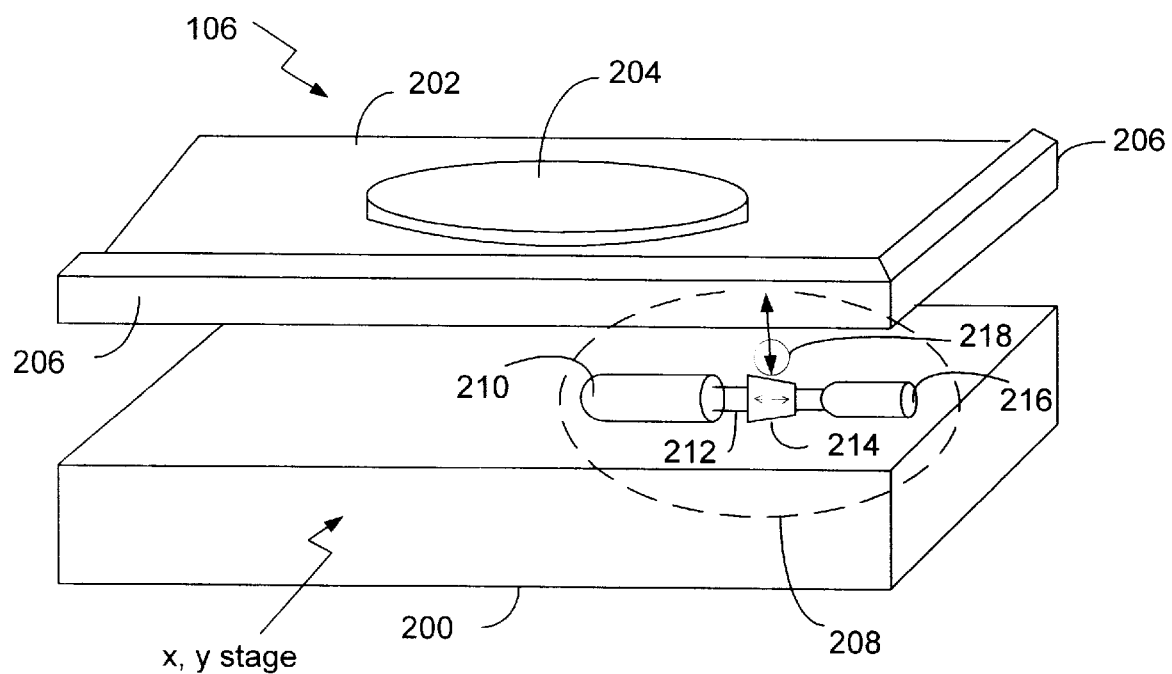
FIG. 2 illustrates a wafer stage including a lower, XY stage and an upper, leveling stage.

The dynamics of the leveling mechanism of the wafer table of FIG. 2 may be represented by the following simplified equation.

$$M(q)\ddot{q} + C(q,\dot{q})\dot{q} + Kq = T \quad (1)$$

where $q = [q_1, q_2, q_3]^T$ is a generalized coordinate measured by the encoders $T = [\tau_1, \tau_2, \tau_3]^T$ is the torque force applied by the three actuator motors M is a 3×3 matrix representing the inertia of the leveling assembly, including the leveling mechanism, the table itself, attachments such as interferometer mirrors, etc.

C is a 3×3 matrix representing centripetal and Coriolis forces of the leveling mechanism.

K represents the stiffness of the leveling mechanism, including stiffness corresponding to springs (not shown) interposed between the upper (leveling) table and the lower (XY) table.

Define the coordinate transformation matrix R as $$Z = R(q) \quad (2)$$

where $Z = (z, \theta_x, \theta_y)^T$ represents the position at the wafer surface. Alternatively, Z may represent the upper surface of the leveling stage. Z may be measured by a standard AL/AF (auto-level/auto-focus) technique. For further reference, please see co-assigned U.S. Pat. No. 5,448,332, issued to Sakakibara et al, incorporation by reference herein. The R matrix transforms coordinates from q to Z, and may be calculated using well-known mathematical techniques.

With respect to differential motion, $$\Delta Z = J(q)\Delta q \quad (3)$$

where J is the Jacobian of R.

Figure 3:
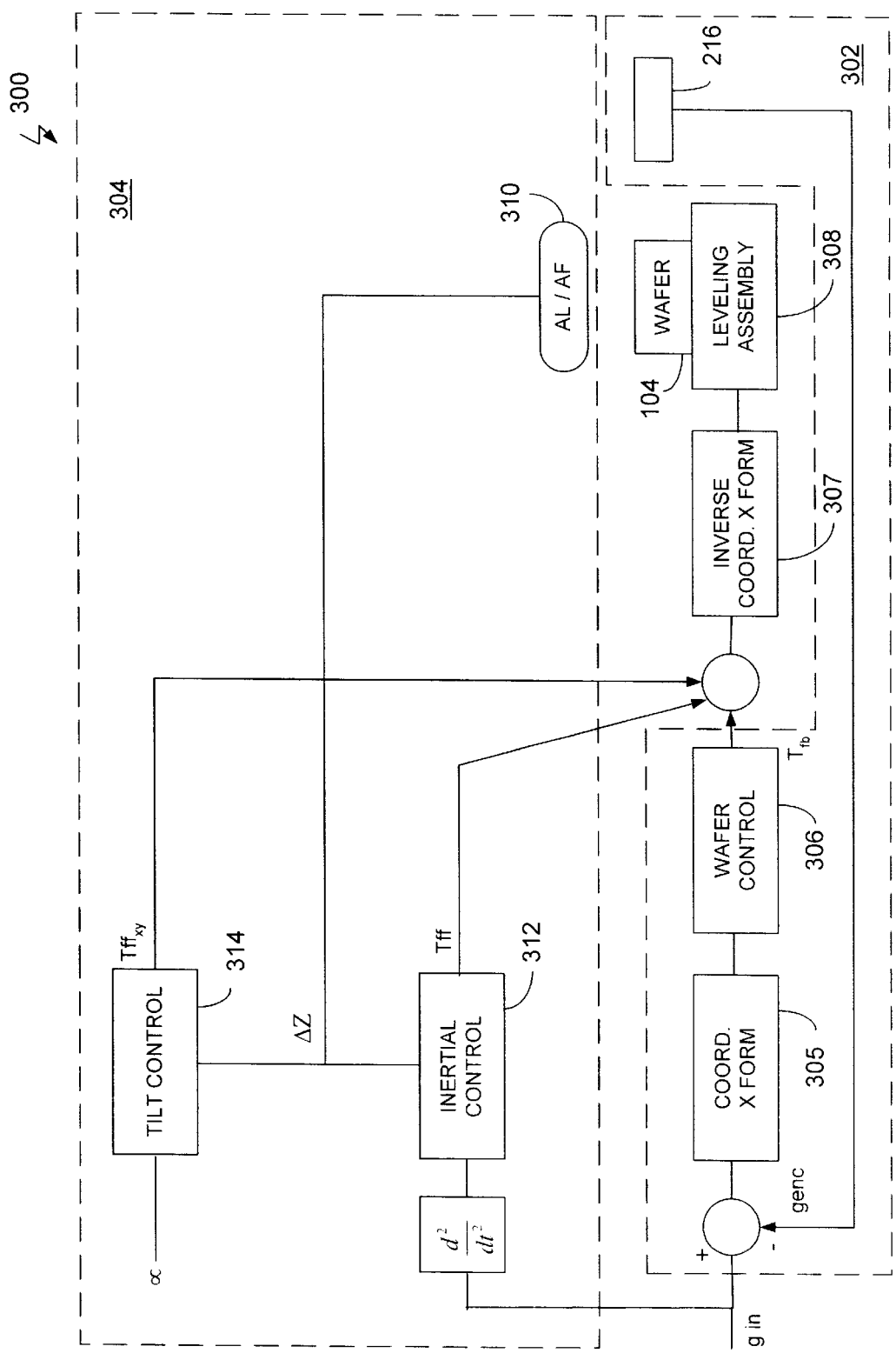
FIG. 3 is a block diagram of the adaptive control system of the present invention.

Now divide the control force T into what will be denoted a "feedback" force and a "feedforward" force. FIG. 3 is a block diagram of the adaptive control system 300 of the present invention that illustrates feedback and feedforward forces applied to the wafer stage. Note that the reticle mechanism and components relating to XY stage control have been omitted so as to not obscure the figure. The system comprises a feedback portion 302 and a feedforward portion 304. The feedback portion 302 includes an encoder 216, which is coupled to the actuator motor 210 and feeds back a signal $q_{enc}$ representing the generalized coordinate at the actuator motor 210. The generalized coordinate is subtracted from the input position q, and transformed by coordinate transform circuitry 305, e.g., using J(q), to represent differential motion at or near the wafer.

Based on this transformed feedback measurement, a wafer controller 306 outputs a torque force $T_{fb}$, which is added to feedforward forces (discussed below). The resulting sum is inversed transformed by inverse transform circuitry 307 back to the generalized coordinate domain, i.e., in coordinates corresponding to the leveling mechanism. This force is applied to the leveling assembly 308, which supports wafer 104. The leveling assembly 308 includes standard components such as the leveling mechanism 208 (e.g., motors, wedges, rollers, etc.) and the leveling stage 202 of FIG. 2.

The feedforward portion 304 includes a sensor 310, such as an AL/AF sensor, which provides a signal ΔZ. The quantity ΔZ represents the change in height of the wafer 104 (or alternatively the upper surface of the stage) over one servo cycle. The servo cycle represents the time period between adjustments in the position of the wafer stage. The use of two sensors (e.g., encoder and AL/AF) for measuring position in the z direction distinguishes the invention from typical conventional systems.

The feedforward portion 304 also includes an adaptive inertial controller 312 that provides a torque output $T_{ff}$, and an adaptive tilt controller 314 that provides a torque force $T_{ffxy}$. All of the torque forces $T_{fb}$, $T_{ff}$ and $T_{ffxy}$ are input to the wafer stage 308 (through inverse transformer 307) to control the actuator motors 210. The feedback force $T_{fb}$ is applied at all times. The feedforward force $T_{ff}$ is applied when commands are input to move the leveling stage in the Z direction. The feedforward force $T_{ffxy}$ is applied when commands are input to move the XY stage in the XY plane.

As is known in the art, feedback controllers such as the feedback wafer controller 306 correct relatively small errors. Conventional feedback controllers cannot completely correct large errors, such as those caused by inertia, and act on such errors only very slowly.

The feedforward control compensates for non-linear dynamics of the leveling assembly (e.g., stage, motors, wedges, rollers, etc.). Focusing first on the adaptive inertial controller 312, the control force T can be rewritten as $$T = T_{ff} + T_{fb} \quad (4)$$

Referring back to Equation (1), the second and third terms are small quantities compared to the first term, and for the most part are corrected by the feedback force $T_{fb}$. It is a good assumption that the feedforward force $T_{ff}$ will compensate the larger first term in Equation (1), as follows. Define $$M(q)\ddot{q} = T_{ff} \quad (5)$$

This equation illustrates that the feedforward force compensates for the inertia of the leveling assembly. This inertia includes all inertial errors between the encoders and the point where Z is measured, e.g., the upper surface of the wafer or the leveling stage. These inertial errors include, but are not limited to, the heavy mass of the leveling stage and nonlinear forces such as backlash, screw flexure, side force effects of the wedges, and nonlinear actuator effects. Traditional feedback action cannot effectively compensate for these errors.

In a real-time implementation, the acceleration $\ddot{q}$ is computed with difficulty. It may contain high-magnitude noise. The acceleration is calculated by taking the double derivative of the input position q. The acceleration is provided by the control computer of the system. The real inertia matrix M may also be unknown. To resolve this problem, a self-tuning or adaptive scheme is used. First, make the following approximation.

$$M(q)\ddot{q} = \hat{M}a \quad (6)$$

where $$a = [a_z, a_{\theta x}, a_{\theta y}]^T$$

The acceleration a is defined as the acceleration in the Z direction. Through this definition, the force $T_{ff}$ compensates for nonlinear dynamics when attempting to move the leveling stage in the Z direction.

Although the inertia is not time varying, the quantity $\hat{M}$ is assumed to be a time-varying system in order to allow it to be adaptively updated. The matrix can be thought of as a virtual inertial mass. The acceleration a is an estimated desired acceleration input corresponding to $\ddot{q}$.

By applying the well-known LMS (least mean square) method, $\hat{M}$ can be updated by the following formula.

$$\Delta \hat{M} = \mu (J^{-1} \Delta Z) a \quad (7)$$

where $\mu$ is a symmetric positive definite matrix related to the correlation function of the input acceleration. A small $\mu$ requires a long convergence time, but typically indicates a stable system. Conversely, a large $\mu$ indicates a fast convergence, but is more likely to represent an unstable system. Calculation of $\mu$ is well known in the art. For further information, please refer to S. Haykin, *Adaptive Filter Theory*, Prentice Hall, 2d edition, 1991, which is incorporated by reference herein.

To initialize the algorithm, $\hat{M}$ can be initialized with each diagonal element representing the mass of the leveling stage.

During the servo cycle in which $\hat{M}$ is updated, the next value of $\hat{M}$ is calculated as follows.

$$\hat{M}_{i+1} = \hat{M}_i + \Delta \hat{M} \quad (8)$$

where i is the servo cycle time index. (Generally, the index is included only where necessary for clarity, but otherwise is omitted for the sake of convenience.)

Based upon the updated value of the inertia, the inertial feedforward force may be calculated as follows.

$$T_{ff} = \hat{M}a \quad (9)$$

The force is applied to the leveling mechanism to compensate for nonlinear dynamics, such as the effect of the inertia on control of the leveling stage. The known prior art ignores the effect of inertia.

Another effect ignored by the known prior art is tilt. When the lower (XY) stage accelerates or decelerates in the XY plane, a nonlinear coupling force will disturb the leveling upper stage in the z direction.

Using a technique similar to that employed to compensate for inertia, the system of the invention first assumes that there exists a virtual disturbance force D due to the effect of the lower stage. D is unknown and is a function of the X and Y acceleration on the lower stage: $a_x$, $a_y$. An additional feedforward force $T_{ffxy}$ is added to compensate this disturbance. To adaptively calculate D, the following approximation is made.

$$D(a_x, a_y) = \hat{D}\alpha \quad (10)$$

The matrix $\hat{D}$ is assumed to be a time-varying system, and is initialized to zero. The matrix $\hat{D}$ can be thought of as a virtual disturbance mass, and is associated with an acceleration:

$$\alpha = [a_x, a_y]^T \quad (11)$$

The XY table acceleration $\alpha$ is known from the control computer command given to the lower stage to move the lower stage along the scan and step path. Alternatively, $\alpha$ may be measured using standard techniques, such as laser interferometry. Through the definition of $\alpha$, the force $T_{ffxy}$ compensates for nonlinear dynamics when the control computer commands the XY stage to move in the XY plane.

$\hat{D}$ may be updated as follows:

$$\Delta \hat{D} = \Gamma (J^{-1} \Delta Z) \alpha \quad (12)$$

The matrix $\Gamma$ is calculated using the same techniques used to calculate the matrix $\mu$ in Equation (7).

During each servo cycle $\hat{D}$ is updated as follows:

$$\hat{D}_{i+1} = \hat{D}_i + \Delta \hat{D} \quad (13)$$

The feedforward force $T_{ffxy}$, applied by the adaptive tilt controller 314, is calculated as follows:

$$T_{ffxy} = \hat{D}\alpha \quad (14)$$

This tilt compensation force is added to the inertial compensation force $T_{ff}$, and the sum is applied to the leveling stage actuators.

The present invention provides for feedforward compensation of non-linear dynamic characteristics of the leveling stage, such as inertia and tilt. By doing so, the system of the present invention provides for more accurate positioning and leveling in the z direction, and a faster settling time than the prior art. In particular, by transforming the position measured by the encoders to position at the stage surface, the invention minimizes errors at the surface while reducing measurement delay.

Although the invention has been described in conjunction with particular embodiments, it will be appreciated that various modifications and alterations may be made by those skilled in the art without departing from the spirit and scope of the invention. For example, the control techniques of the invention do not apply only to a typical wafer stage. Therefore, the term "stage" as used herein means not only a stage used to support a semiconductor workpiece, but any object for which motion is controlled. Moreover, the invention may be incorporated into (and thereby include) a conventional semiconductor exposure system with appropriate modifications. Further, please note that the term "circuitry" as used herein includes any hardware, software or firmware that may be used to achieve the desired functionality. The invention is not to be limited by the foregoing illustrative details, but rather is to be defined by the appended claims.

What is claimed is:

1. A method for controlling motion of a stage or wafer, the method comprising the steps of:

driving the stage or wafer toward a target position;

measuring position of the stage or wafer; and based upon the measured position, correcting for nonlinear dynamics of the stage or wafer, wherein the nonlinear dynamics include inertia.

2. The method of claim 1, wherein the correcting step includes the step of adaptively estimating the inertia of the stage.

3. The method of claim 1, wherein the correcting step includes the step of adaptively estimating the tilt of the stage.

4. The method of claim 1, wherein the correcting step includes the step of adaptively estimating the tilt of the stage.

5. The method of claim 1, wherein the stage generally travels in a plane, and the measuring step comprises the step of measuring position in a direction orthogonal to the plane.

6. The method of claim 1, wherein the measuring step comprises the step of measuring position at an actuator driving the stage, and transforming the actuator position to the measured position of the stage, wherein the measured position represents position at or near an upper surface of the stage in the z direction.

7. The method of claim 1, wherein the measuring step comprises the step of measuring the position of an upper surface of the stage.

8. The method of claim 1, wherein the measuring step comprises the step of measuring the position of a workpiece supported by the stage.

9. The method of claim 11, wherein the workpiece is a semiconductor wafer, further comprising the step of exposing a pattern onto the wafer.

10. The method of claim 1, wherein the correcting step corrects for nonlinear dynamics while the stage is driven toward a target position in the Z direction.

11. The method of claim 1, wherein the correcting step corrects for nonlinear dynamics while the stage is driven toward a target position in the XY plane.

12. The method of claim 1, wherein the correcting step comprises the step of applying a correction force in a feedforward path.

13. The method of claim 1, wherein the nonlinear dynamics further include tilt.

14. A method for controlling motion of a stage or wafer, the method comprising the steps of:

driving the stage or wafer toward a target position;

measuring position of the stage or wafer in a z direction; and based upon the measured position, applying a feedforward force to adaptively control motion of the stage, wherein the measuring step comprises using two sensors for measuring the stage or wafer position in the z-direction.

15. The method of claim 14, wherein the applying step comprises the step of adaptively correcting for nonlinear dynamics of the stage.

16. The method of claim 15, wherein the correcting step comprises the step of correcting for nonlinear dynamics while the stage is driven toward a target position in the Z direction.

17. The method of claim 15, wherein the correcting step comprises the step of correcting for nonlinear dynamics while the stage is driven toward a target position in the XY plane.

18. The method of claim 14, wherein the applying step comprises the step of adaptively estimating inertia of the stage.

19. The method of claim 14, wherein the applying step comprises the step of adaptively estimating tilt of the stage.

20. The method of claim 14, wherein the stage generally travels in a plane, and the measuring step comprises the step of measuring position in a direction orthogonal to the plane.

21. The method of claim 14, wherein the measuring step comprises the step of measuring the position of an upper surface of the stage.

22. The method of claim 14, wherein the measuring step comprises the step of measuring the position of a workpiece supported by the stage.

23. The method of claim 22, wherein the workpiece is a semiconductor wafer, further comprising the step of exposing a pattern onto the wafer.

* * * * *